United States Patent [19]

Glogolja

[11] 4,375,074

[45] Feb. 22, 1983

[54] DUAL-MODE TRANSISTOR TURN-OFF

[75] Inventor: Miroslav Glogolja, Somerville, N.J.

[73] Assignee: Reliance Electric Company, Cleveland, Ohio

[21] Appl. No.: 176,358

[22] Filed: Aug. 8, 1980

[51] Int. Cl.³ .............................................. H02H 9/04
[52] U.S. Cl. ..................................... 361/91; 361/101; 307/254
[58] Field of Search .................. 361/91, 100, 101, 86, 361/88; 330/207 P, 298; 307/300, 253, 254, 549, 567

[56] References Cited

U.S. PATENT DOCUMENTS

| | | | |
|---|---|---|---|
| 3,244,910 | 4/1966 | Leifer | 307/254 |
| 3,449,598 | 6/1969 | Wright | 361/91 |
| 4,006,370 | 2/1977 | Erler | 361/91 X |
| 4,132,906 | 1/1979 | Allen | 307/300 X |
| 4,158,866 | 6/1979 | Baker | 361/88 X |
| 4,224,535 | 9/1980 | Wilson et al. | 307/254 X |

Primary Examiner—Reinhard J. Eisenzopf
Attorney, Agent, or Firm—Allan M. Lowe; Kenneth Watov

[57] ABSTRACT

A method and apparatus for applying a reverse bias voltage to the base-emitter junction of a transistor, for turning off the transistor from a normal conduction state, or for connecting a relatively low impedance current path between the base and emitter electrodes for turning off the transistor from a fault conduction state.

19 Claims, 4 Drawing Figures

FORWARD BIAS SAFE OPERATING AREA (FBSOA)

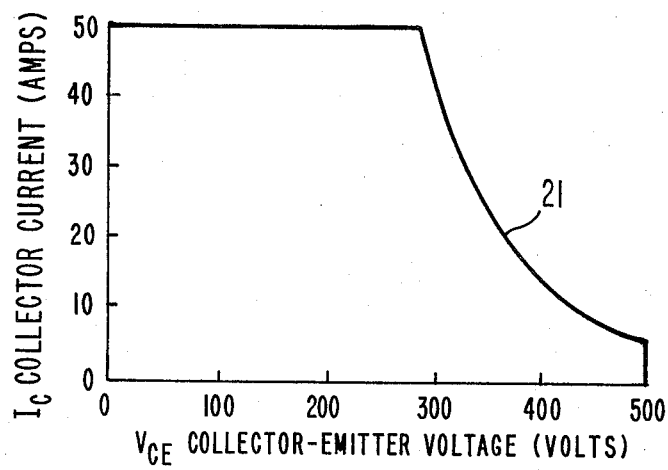
REVERSE BIAS SAFE OPERATING AREA (RBSOA)
Fig_3_
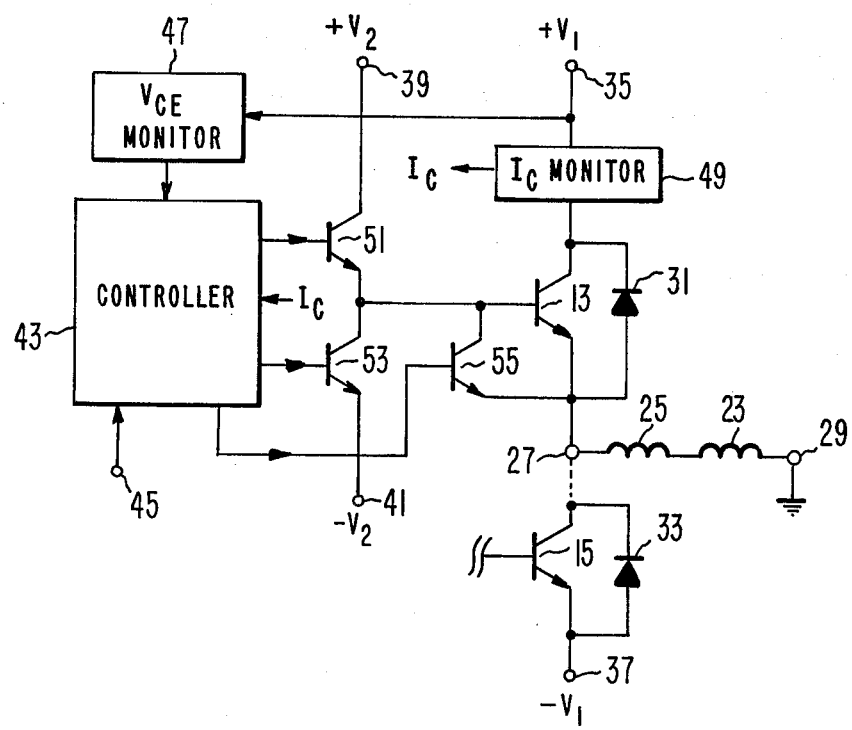
Fig_4_

DUAL-MODE TRANSISTOR TURN-OFF

The field of the present invention relates generally to protection circuits for a transistor, and more specifically to circuitry for safely turning off a transistor from an overload condition.

In many applications switching transistors are operated to supply power or transfer current into a reactive load, such as inductive or capacitive loads, for example. In turning on and turning off, for applying and removing power from such reactive loads in a step-like manner, switching transients are developed by these loads, causing peak power dissipation in the associated switching transistor or transistors during such switching times. When a transistor is turned on, and during the period of time that the transistor is maintained in a turned on or conducting state, its power handling capability is limited by a forward bias safe operating area (FBSOA) specification for the transistor. Bipolar transistors are typically turned off by applying a reverse-bias voltage to the base electrode of the transistor substantially concurrently with removing the drive current signal from the base electrode. The power handling capability of bipolar switching transistors during turn-off is specified as a reverse-bias safe operating area (RBSOA), and represents the voltage-current condition allowable during reverse biased turn-off. When the base-emitter junction of a bipolar transistor is reverse biased for turning off power from an inductive load, both high voltage and high current must be sustained simultaneously by the switching transistor as it turns off. To prevent the RBSOA characteristics of a switching transistor from being exceeded, it is known in the field of art to provide active clamping, passive or resistor-capacitor snubbing, load-line shaping, and so forth. However, these known methods of protecting a transistor from over dissipation during turn-off with the base-emitter junction reversed biased, do not protect the transistor from damage or destruction if for some reason the reverse bias is applied at a time when the transistor is conducting outside of its RBSOA characteristic.

The present inventor has discovered a method and apparatus for providing safe turn-off of a transistor from conduction in an area outside of its RBSOA characteristic during a fault condition and from a normal mode of conduction by applying a reverse bias across the transistor base-emitter electrodes. The inventive method includes the steps of sensing the voltage between the collector and emitter electrodes of a transistor when turned on; removing the drive current to the base electrode of the transistor, while substantially concurrently connecting a relatively low-impedance current conduction path between the base and emitter electrodes thereof, whenever the level of the sensed voltage equals or exceeds a predetermined level indicative of a fault condition, for initiating the turn-off of the transistor; and removing the drive current to the base electrode, while substantially concurrently connecting a predetermined level of reverse bias voltage to the base electrode, for selectively turning-off the transistor from a normal conduction state, as indicated by the sensed voltage being below the predetermined level.

In the drawings:

FIG. 3 is a reverse bias safe operating area curve for the transistor of FIG. 2; and FIG. 4 is a circuit schematic diagram of one embodiment of the present invention.

Figure 1:
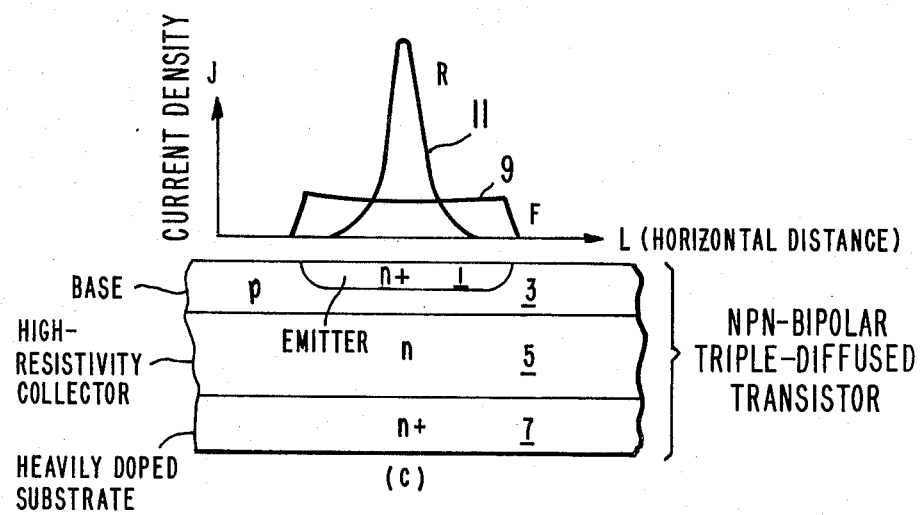
FIG. 1 is a schematic cross sectional view of an NPN bipolar triple-diffused transistor, and a plot of the current density versus horizontal distance for forward and reverse bias drive.
Figure 2:
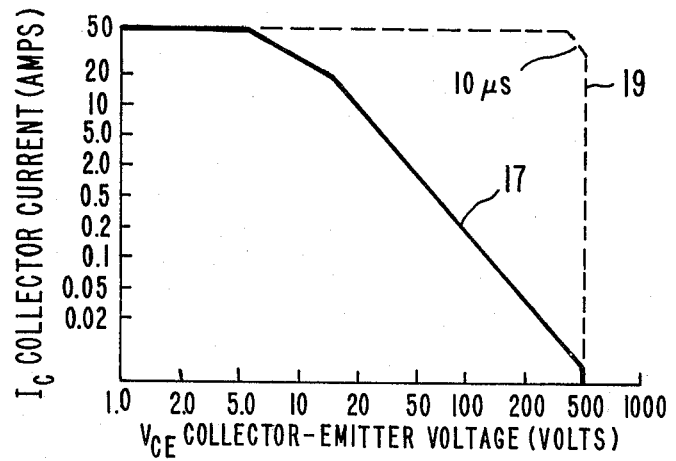
FIG. 2 is a forward bias safe operating area curve for an MJ 10016 transistor manufactured by Motorola Inc., Phoenix, Arizona, USA.

Switching transistors are in many applications used for selectively applying power to an inductive load, for example, the windings of a motor. In FIG. 1, the cross-section of a typical NPN bipolar transistor is shown. The transistor includes an emitter region 1 of n+material, a base region 3 of p material, a high-resistivity collector region 5 of n material, and a heavily doped substrate region 7 of n+material, for example. Located immediately above the cross-section of the transistor are curves 9 and 11, respectively for the current density J versus horizontal distance L typically existing in the substrate during times of forward bias F of the emitter 1 and base 3 junction, and reverse bias R of the same junction. During conditions of reverse bias the magnitude of current crowding in the emitter 1 during turn off is much greater than the current crowding during forward bias of this junction; the current being more evenly spread across the emitter region 1 during the latter condition. Accordingly, the heat generated during conditions of forward bias is more evenly spread across the substrate, in comparison to the reverse bias condition during turn-off. The inherent current crowding in the emitter during reverse bias causes a centralized hot spot to be formed. Accordingly, the forward bias safe operating area is typically greater than the reverse bias safe operating area for a transistor, as shown in FIGS. 2 and 3, respectively.

In developing the method and apparatus of this invention, the present inventor used a DGOT NPN transistor (manufactured by Westinghouse of Youngwood, Pennsylvania, U.S.A.) for each one of the output transistors 13 and 15 of FIG. 4. In FIG. 2, the curve 17 represents the DC limit of the FBSOA for a typical transistor, while the dashed line curve 19 represents the limit for a single 10 microsecond pulse. Typically, the curve 19 is obtained by applying a forward bias across the base-emitter junction 1,3 of a transistor for 10 microseconds, after which time the base connection is opened for turning off the transistor. The illustrated transistor can withstand; during conditions of forward bias, a maximum current magnitude of 50 amps at 400 volts for 10 microseconds, and a maximum voltage of 500 volts at 30 amps for 10 microseconds, in the limit. In comparison, power dissipations of this transistor for reverse bias is limited in the extremes to either 50 amperes at 300 volts, or 5 amperes at 500 volts, as shown by curve 21 of FIG. 3.

As previously mentioned, the application of a reversed bias between the base and emitter junction of a transistor for turning-off the transistor from a conductive state causes high current densities in the emitter region, resulting in hot spots and greater stressing of the substrate during turn-off than during the forward bias conduction mode of operation. However, reverse bias turn-off is used in many applications for reducing the fall time in turning off the transistor, thereby reducing switching losses. Accordingly, in high-frequency switching applications, it is preferred and most often necessary to use reverse bias turn-off techniques.

In conducting laboratory tests, the present inventor discovered that a transistor can be turned off from a conduction state at the maximum rating of its FBSOA for a single pulse by applying a low impedance between the base and emitter electrodes of the transistor while concurrently removing the base drive current therefrom. This discovery is incorporated in the present invention, which includes a method and apparatus that provides the advantages of both the reverse bias turn-off mode and the newly discovered turn-off mode. In the FIG. 4 embodiment, each one of the output transistors 13 and 15 is protected; transistors 13 and 15 are typically connected in an inverter circuit configuration for driving a motor winding 23, for example. The motor winding 23 is connected in series with a current limiting inductor 25 between an output terminal 27, and a reference terminal 29. Diodes 31 and 33 are connected in antiparallel across the main current paths of transistors 13 and 15, respectively, for providing bilateral current flow for the inductive load impedance. Operating voltages $+V_1$ and $-V_1$ are applied to operating voltage terminals 35 and 37, respectively. Also, operating voltages $+V_2$ and $-V_2$ are applied to operating voltage terminals 39 and 41, respectively.

The FIG. 4 example of a protection circuit for carrying out the method of the present invention, also includes a controller 43 having a terminal 45 for receiving an input signal, a $V_{CE}$ monitor 47 for sensing the level of voltage between the collector and emitter electrodes of transistor 13 when conducting, an $I_C$ Monitor 49 for sensing the magnitude of the collector current of transistor 13, and transistors 51, 53, and 55, all connected as shown for controlling the operation of transistor 13, while protecting this transistor during its period of conduction. A similar circuit, which in certain applications could share the controller 43, can be used for controlling the operation of transistor 15 and for protecting this transistor for overload conditions, but this circuit is not shown in FIG. 4 for purposes of simplification. Operation of the circuit of FIG. 4 will now be described.

When a high level input signal is applied to input terminal 45, for example, controller 43 responds thereto by supplying a drive current signal or a high level signal to the base electrode of transistor 51, for turning on this transistor. When transistor 51 turns on, the impedance between the collector and emitter thereof substantially decreases, permitting current to flow there through, from the source of voltage $+V_2$ into the base electrode of output transistor 13, causing turn on of transistor 13. Turning on substantially lowers the impedance of its main current path between its collector and emitter electrodes, thereby permitting current to flow from the source of voltage $+V_1$ into the series combination of the load 23 and current limiting inductor 25, to the source of reference potential connected to reference terminal 29. In this example the source of reference potential is shown as ground. When transistor 13 so turns on, the voltage drop between its collector and emitter electrodes substantially reduces because of the corresponding reduction in impedance therebetween. Typically, the $V_{CE}$ of a switching transistor in saturation is about 0.5 volt. The $V_{CE}$ monitor 47 senses the level of $V_{CE}$ of transistor 13 when conducting. If a fault condition occurs, such as a short across the load 23, assuming that transistor 13 was initially conducting in a saturation state, the transistor will be forced out of saturation by the large fault current, causing its $V_{CE}$ to rapidly increase above its saturation voltage level. The $V_{CE}$ monitor senses the sudden increase in the $V_{CE}$ of transistor 13, and applies a high level fault signal to the controller 43. Controller 43 responds to the change in level of the fault signal from high to low by removing the drive current signal from transistor 51, turning off this transistor, for removing the drive current signal from transistor 13. Also, the controller simultaneously applies a drive current signal or high level signal to the base electrode of transistor 55, for turning on this transistor. When transistor 55 so turns on, the impedance between its collector and emitter electrodes substantially reduces for providing a very low impedance current path between the base and emitter electrodes of transistor 13, permitting transistor 13 to safely turn off from its fault condition. Also, the controller 43 maintains low level signals at the base electrodes of transistors 51 and 53, for maintaining these transistors turned off.

The $V_{CE}$ monitor 47 can be provided by many known designs. For example, in U.S. Pat. No. 4,158,866, issued on June 19, 1979, for *PROTECTION CIRCUIT FOR TRANSISTORIZED SWITCH*, one such $V_{CE}$ monitor circuit is taught. The $V_{CE}$ monitor 47 can be designed to change the level of fault signal from a low to a high level in the response to the $V_{CE}$ of transistor 13 increasing from a relatively low voltage level to some predetermined level. Usually the predetermined level for triggering the $V_{CE}$ monitor 47 is set close to the saturation voltage level of the transistor being protected, in order to insure the fastest response to the circuit of the transistor going out of saturation from a saturated conduction state. However, as previously indicated, in certain applications it may be desirable to set the predetermined triggering level at some other level than the saturation voltage level of the transistor.

Assume that transistor 13 has been turned on as previously described, and that a no fault condition occurs while this transistor is conducting. When the input signal applied to terminal 45 has a level change from high to low, in this example, the controller 43 responds by removing the base drive signal from transistor 51 and applying a low level signal thereto, for turning off transistor 51. At the same time, controller 43 changes the level of the signal at the base electrode of transistor 53 from low to high, for supplying current thereto, causing transistor 53 to turn on while transistor 51 is turning off. When transistor 53 is so turned on, the impedance between its collector and emitter electrodes is substantially reduced, for applying reverse bias voltage or operating voltage $-V_2$ (less than $V_{CE}$ of transistor 53) to the base electrode of transistor 13, the drive current signal having been just previously removed there-from via the turn-off of transistor 51. The reverse bias at the base electrode of transistor 13, causes this transistor to very rapidly turn-off, as previously explained.

In certain applications, it is desirable to modulate the level of current applied to the base electrode of transistor 53, for controlling the level of impedance between its collector and emitter electrodes, for in turn affecting control of the level of reverse bias voltage applied to the base of transistor 13. The magnitude of the base current applied to transistor 53 is increased with decreasing magnitude of load current, for minimizing the turn-off switching losses associated with transistor 13. Within a range, the turn-off time for a transistor can be minimized in this manner. However, with a relatively high lead current magnitude, approaching the RBSOA rating of the transistor, the optimum value of the reverse bias voltage $-V_2$ depends on the switching frequency and the magnitude of the load current. It is important to note that even in such mode of operation, the RBSOA limit can be exceeded by reducing the level of the reverse bias voltage, that is making this voltage less negative, providing that the switching frequency is not too high.

To optimize reverse bias voltage level $-V_2$, the $I_C$ monitor 49 is connected terminal 35 and the collector of transistor 13 for sensing the magnitude of the collector current and providing a signal $I_C$, indicative of this magnitude, to the controller 43. Within a range, the controller 43 can be designed to adjust the magnitude of the base current to transistor 53 in inverse proportion to the magnitude of the collector current $I_C$, for increasing the level of reverse bias voltage applied to transistor 13 with decreasing magnitude of collector $I_C$ (equivalent to load current), or vice versa.

As an alternative to modulating the magnitude of the base current applied to transistor 53, for optimizing the level of the reverse bias applied to transistor 13, the controller can be designed for controlling a programable voltage source supplying $-V_2$, in response to the magnitude of $I_C$. A programmable supply is not shown in FIG. 4.

The controller 43 may be provided by a combination of digital and analog logic, as known to one skilled in the art. Alternatively, the controller 43 may include a micro-processor programmed to provide a majority of the functions thereof.

Accordingly, as shown above, the present invention provides fast turn-off of a transistor from normal operating conditions via the use of a reverse bias between its base and emitter electrodes. In addition, when a fault condition occurs, causing an overload condition which forces the transistor to conduct out of saturation, a low impedance current path is connected between the base and emitter electrodes of the transistor to safely turn it off from the overload condition. However, after a few microseconds, if desired, the reverse bias can be reapplied by programing the controller to thereafter turn-off transistor 55 and turn-on transistor 53, while maintaining transistor 51 turned off. Lastly, note that via the present invention, it has been determined that a transistor can be turned off from its maximum rated voltage and current as shown in its FBSOA, via the application of the low impedance between its base and emitter electrodes, but with a turn-off time that is relatively longer than the turn-off time obtained from reverse bias turn-off from a normal conduction condition.

What is claimed is:

1. In a protection circuit for a switching transistor having collector, emitter and base electrodes, said base electrode being responsive to a drive current signal for selectively turning on said transistor, a method for turning off said transistor from conduction of a fault current of substantially higher magnitude than that of the maximum current magnitude determined by the reverse bias safe operating area specification for said transistor, the method comprising the steps of:
   (a) sensing the voltage between the collector and emitter electrodes of said transistor when turned on;
   (b) initiating turn-off of said transistor by removing the drive current to said base electrode while substantially concurrently connecting a relatively low impedance current conduction path between said base and emitter electrodes whenever the level of said sensed voltage equals or exceeds a predetermined level indicative of a fault condition; and
   (c) removing the drive current to said base electrode while substantially concurrently connecting a predetermined level of reverse bias voltage to said base electrode, for selectively turning off said transistor from a normal conducting state, as indicated by said sensed voltage being below said predetermined level.

2. The apparatus of claim 1 wherein the base electrode is connected to the predetermined reverse bias voltage level via a branch circuit that is unresponsive to the drive current.

3. The method of claim 1 or 2, wherein step (b) further includes setting said predetermined level of sensed voltage to a level within a predetermined differential of the saturation voltage of said transistor, said differential being indicative of said transistor going from a saturated to an unsaturated conduction state.

4. The method of claim 1, wherein step (c) further includes the step of increasing the level of reverse bias voltage with decreasing magnitude of collector current in a range of magnitudes of collector current to minimize the turn-off time for said transistor switching losses.

5. A method of protecting a transistor operated in a saturated emitter collector mode from the effects of a fault, such as a short circuit, occuring in a load connected in an emitter collector path of the transistor, the transistor being operated in the saturated mode in response to drive signal applied to the base electrode of the transistor, comprising:
   removing the drive signal substantially simultaneously with inserting a low impedance shunt between the emitter and base electrodes in response to detection of the fault; and applying a reverse bias to the base electrode while removing the low impedance shunt a few microseconds after the drive signal was removed and the shunt was inserted.

6. The method of claim 5, comprising:
   controlling the level of the applied reverse bias as a function of current level flowing in the collector.

7. The method of claim 6, wherein the level of the reverse bias increases with decreasing magnitudes of collector current.

8. The method of claim 5, 6 or 7, wherein the fault is detected by sensing a sudden voltage increase between the emitter and collector electrodes.

9. Apparatus for protecting a transistor having emitter, base, and collector electrodes from the effects of a fault, such as a short circuit, occurring in a load circuit for the transistor emitter collector path while the transistor is saturated, comprising:
   means connected to be responsive to the fault for driving a fault indicating signal in response to the fault occurring, bias means for selectively driving the base so the transistor is saturated and reverse biasing the base, means for selectively shunting the emitter and base, and a controller responsive to the fault indicating signal for controlling the bias means and the means for shunting, the controller controlling the bias means and the means for shunting so:
   (a) with no fault occuring the transistor is driven to saturation and the shunt is not applied in response to a command for the transistor to conduct,
   (b) the base drive is removed while the shunt is applied in response to the fault occurring while the transistor is commanded to conduct, and (c) the reverse bias is applied while the shunt is removed shortly after (b).

10. The apparatus of claim 9, wherein the fault indicating signal deriving means comprises means for sensing sudden changes in voltage between the emitter and collector.

11. The apparatus of claim 9, wherein the bias means includes a second transistor having a second emitter collector path in series between a forward bias source and the base, means connected to be responsive to the fault for deriving a fault indicating signal in response to the fault occurring, the means for shunting including a third transistor having a third emitter collector path connected across the base and emitter.

12. The apparatus of claim 9, wherein the bias means includes a second transistor having a second emitter collector path in series between a forward bias source and the base.

13. The apparatus of claim 9, wherein the means for shunting includes a second transistor having an emitter collector path connected across the base and emitter.

14. The apparatus of claim 9, wherein the bias means includes a second transistor having a second emitter collector path in series between a forward bias source and the base, and a third transistor having a third emitter collector path in series between a reverse bias d.c. source and the base; the means for shunting including a fourth transistor having a fourth emitter collector path connected across the base and emitter.

15. Apparatus for controlling operation of a transistor having base, emitter and collector electrodes between cut-off and saturated conditions in response to an input control signal and for protecting the transistor from the effect of a fault, such as a short circuit occurring in a load circuit for the transistor emitter collector path while the transistor is saturated, comprising means connected to be responsive to the fault for deriving a fault indicating signal in response to the fault occurring, bias means for selectively driving the base so the transistor is saturated and reverse biasing the base, means for selectively shunting the emitter base, and a controller responsive to the input command signal and the fault indicating signal for controlling the bias means and the means for shunting, the controller controlling the bias means and the means for shunting so: (a) with no fault occurring, the transistor is driven to saturation and the shunt is not applied in response to a first level for the input command signal and the transistor is back biased in response to a second level for the input command signal, and (b) with a fault occurring and the command signal having the first level the base drive is removed while the shunt is applied and (c) the reverse bias is applied while the shunt is removed shortly after (b).

16. The apparatus of claim 9 or 15 further including means connected to be responsive to current flowing in the emitter collector path for deriving a signal indicative of the current level flowing in the emitter collector path, the controller being responsive to the current level indicating signal to control the level of the applied reverse bias.

17. The apparatus of claim 16, wherein the fault indicating signal deriving means comprises means for sensing sudden changes in voltage between the emitter and collector.

18. Apparatus for protecting a transistor having emitter, base, and collector electrodes from the effects of a fault, such as a short circuit, occurring in a load circuit for the transistor emitter collector path while the transistor is saturated, comprising:
 means connected to be responsive to the fault for deriving a fault indicating signal in response to the fault occurring, bias means for selectively driving the base so the transistor is saturated, means for selectively shunting the emitter and base, and a controller responsive to the fault indicating signal for controlling the bias means and the means for shunting, the controller controlling the bias means and the means for shunting so:
 (a) with no fault occurring the transistor is driven to saturation and the shunt is not applied in response to a command for the transistor to conduct, and
 (b) the base drive is removed while the shunt is applied in response to the fault occurring while the transistor is commanded to conduct, the bias means including a second transistor having a second emitter collector path in series between a forward bias source and the base, means connected to be responsive to the fault for deriving a fault indicating signal in response to the fault occurring, the means for shunting including a third transistor having a third emitter collector path connected across the base and emitter.

19. Apparatus for protecting a transistor having emitter, base, and collector electrodes from the effects of a fault, such as a short circuit, occurring in a load circuit for the transistor emitter collector path while the transistor is saturated, comprising:
 means connected to be responsive to the fault for deriving a fault indicating signal in response to the fault occurring, bias means for selectively driving the base so the transistor is saturated, means for selectively shunting the emitter and base, and a controller responsive to the fault indicating signal for controlling the bias means and the means for shunting, the controller controlling the bias means and the means for shunting so:
 (a) with no fault occurring the transistor is driven to saturation and the shunt is not applied in response to a command for the transistor to conduct, and
 (b) the base drive is removed while the shunt is applied in response to the fault occurring while the transistor is commanded to conduct, the bias means including a second transistor having a second emitter collector path in series between a forward bias source and the base.

* * * * *